United States Patent
Miyake

(10) Patent No.: US 8,896,113 B2
(45) Date of Patent: Nov. 25, 2014

(54) BASE PLATE AND SEMICONDUCTOR DEVICE

(75) Inventor: Eitaro Miyake, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/607,522

(22) Filed: Sep. 7, 2012

(65) Prior Publication Data
US 2013/0069216 A1   Mar. 21, 2013

(30) Foreign Application Priority Data

Sep. 21, 2011   (JP) .................. 2011-205707

(51) Int. Cl.
*B32B 3/24* (2006.01)
*H01L 21/50* (2006.01)
*H01L 23/02* (2006.01)
*H01L 23/00* (2006.01)
*H01L 23/40* (2006.01)
*H01L 23/24* (2006.01)

(52) U.S. Cl.
CPC ....... *H01L 21/50* (2013.01); *H01L 2924/15787* (2013.01); *H01L 2224/291* (2013.01); *H01L 2924/0781* (2013.01); *H01L 2924/01029* (2013.01); *H01L 2224/83385* (2013.01); *H01L 24/32* (2013.01); *H01L 2924/3511* (2013.01); *H01L 2224/2919* (2013.01); *H01L 2924/16152* (2013.01); *H01L 23/02* (2013.01); *H01L 24/29* (2013.01); *H01L 23/24* (2013.01); *H01L 23/4006* (2013.01)
USPC ...... 257/687; 257/712; 257/713; 257/E23.08; 257/23.083; 257/E23.084; 257/E23.18

(58) Field of Classification Search
USPC ............ 257/687, 712, 713, E23.08, E23.083, 257/E23.084, E23.18
See application file for complete search history.

(56) References Cited

U.S. PATENT DOCUMENTS

| | | | | | |
|---|---|---|---|---|---|
| 3,476,177 | A | * | 11/1969 | Potzl | 165/80.3 |
| 3,780,795 | A | * | 12/1973 | Arnold | 165/80.2 |
| 5,557,503 | A | * | 9/1996 | Isaacs et al. | 361/719 |
| 5,920,119 | A | * | 7/1999 | Tamba et al. | 257/718 |

FOREIGN PATENT DOCUMENTS

| | | |
|---|---|---|
| JP | H06-268121 | 9/1994 |
| JP | H08-204071 | 8/1996 |
| JP | 09232512 A | 9/1997 |
| JP | 2000-091481 | 3/2000 |
| JP | 2000200865 A | 7/2000 |
| JP | 2003-243584 | 8/2003 |
| JP | 2004-022964 | 1/2004 |
| JP | 2006-100320 | 4/2006 |
| JP | 2006179648 A | 7/2006 |
| JP | 2012-212788 | 11/2012 |

OTHER PUBLICATIONS

English Machine Translation of JP 08-204071, Ueda Kazuhiro, Published Aug. 9, 1996.*
English Translation of Japanese Office Action; Patent Application No. 2011-205707; Dispatch Date Jan. 30, 2014.

* cited by examiner

*Primary Examiner* — Peniel M Gumedzoe
(74) *Attorney, Agent, or Firm* — Patterson & Sheridan LLP

(57) ABSTRACT

According to one embodiment, the base plate includes first and a second faces that are opposed to each other; the second face has a contoured rear surface, and the first area is set in the center of the plate. There is a second area with via holes in the peripheral areas of the center part. Also, the thickness of the second area is less than the thickness of the first area.

15 Claims, 10 Drawing Sheets

PRACTICAL EXAMPLE    WITHOUT LOAD

COMPARATIVE EXAMPLE    WITHOUT LOAD

PRACTICAL EXAMPLE   WITH LOAD

COMPARATIVE EXAMPLE   WITH LOAD

BASE PLATE AND SEMICONDUCTOR DEVICE

CROSS-REFERENCE TO RELATED APPLICATION

This application is based upon and Claims the benefit of priority from Japanese Patent Application No. 2011-205707, filed Sep. 21, 2011; the entire contents of which are incorporated herein by reference.

FIELD

Embodiments described herein relate to a base plate and a semiconductor device.

BACKGROUND

In a power semiconductor device, a substrate upon which a power semiconductor chip is formed is bonded to abase plate. The base plate is screwed or otherwise attached to a heat sink, in order to dissipate the heat generated by the electrification in the power semiconductor chip.

In this type of semiconductor device, in order to improve the contact of the base plate and the heat sink with one another, the base plate is warped into a convex shape on the heat sink side thereof. On the periphery of the base plate, via holes are provided in order to insert screws therethrough to secure the base plate to a heat sink.

The periphery of the base plate is spaced from the heat sink upon initial placement of the base plate on the heat sink. When tightening the base plate with a screw, the periphery of the base plate will be pushed down and will become distorted into a shape matching the profile of the heat sink.

If the distortion resulting from the screwing operation propagates into the interior of the base plate, where the semiconductor device is bonded thereto, the power semiconductor chip will be affected by forces which tend to peel it or shear it from the base plate. As a result, bonding parts are destroyed, or internal stresses in the chip will increase, which degrades in the long-term reliability of the power semiconductor device.

DETAILED DESCRIPTION

Figure 1A:
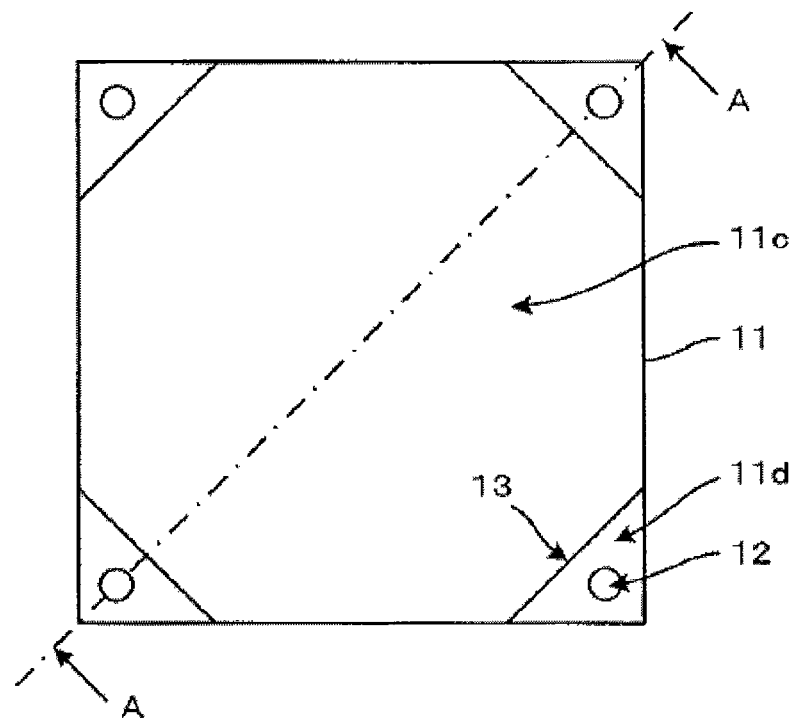
FIGS. 1A and 1B show a sectional view of a base plate according to a first embodiment.

In general, according to one embodiment, the examples of this invention will be explained by referring to the drawings as follows.

According to the embodiment, there is provided a base plate and a semiconductor device in order to be able to mitigate the distortion caused by the screwing operation.

According to an embodiment, the base plate has two faces that are opposed to one another, and the second face is in a convex shape. (As shown in the figure, both the first and second faces may have a matching contour). The base plate is equipped with a first region provided in the center thereof, and a second region which excludes the center extends around the central region, and includes via holes therethrough in the periphery thereof. The thickness of this second region is less than the thickness of the first region.

According to another embodiment, in the semiconductor device, the base plate has two faces that are opposed to one another, and the second face has a convex shape. The base plate is equipped with a first region in the center thereof and a second region which excludes the center region and extends thereabout with via holes extending through the periphery thereof. The thickness of this second region is less than that of the first region. A semiconductor chip is placed on, and bonded by a bonding agent to, the first side of the first region of the base plate.

(Embodiment 1)

Figure 1B:
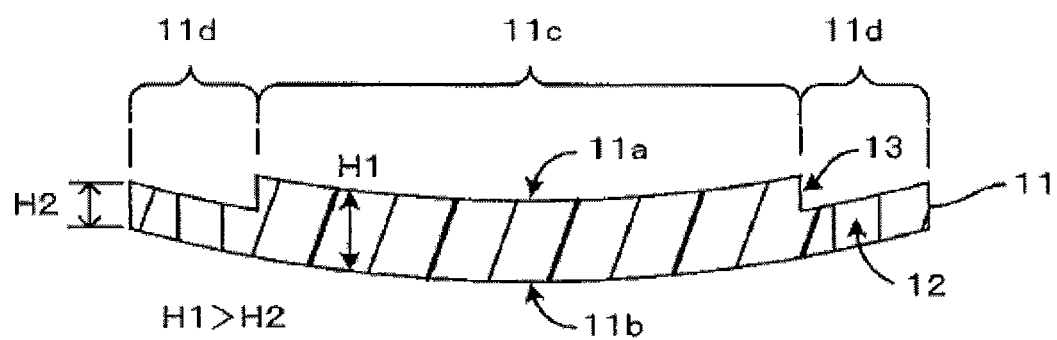

The base plate and the semiconductor device in this embodiment will be explained by referring to FIGS. 1A and 1B and FIGS. 2A to 2C. FIGS. 1A and 1B are figures showing the base plate in this embodiment, FIG. 1A is a plan view of the base plate, and FIG. 1B is a cross-sectional view in the direction of the arrow cut along the line A-A in FIG. 1A.

Figure 2A:
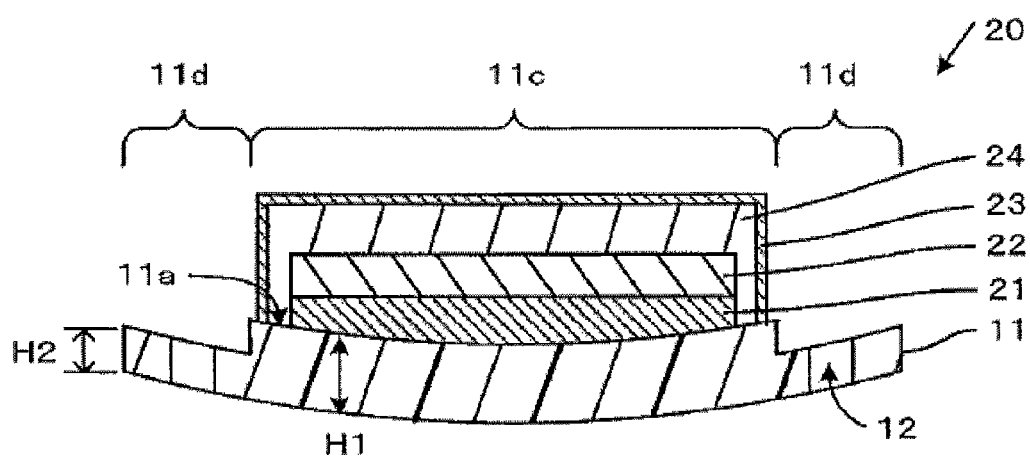
FIGS. 2A to 2C are cross-sectional views showing a semiconductor device bonded to the base plate of FIG. 1 according to the first embodiment.
Figure 2B:
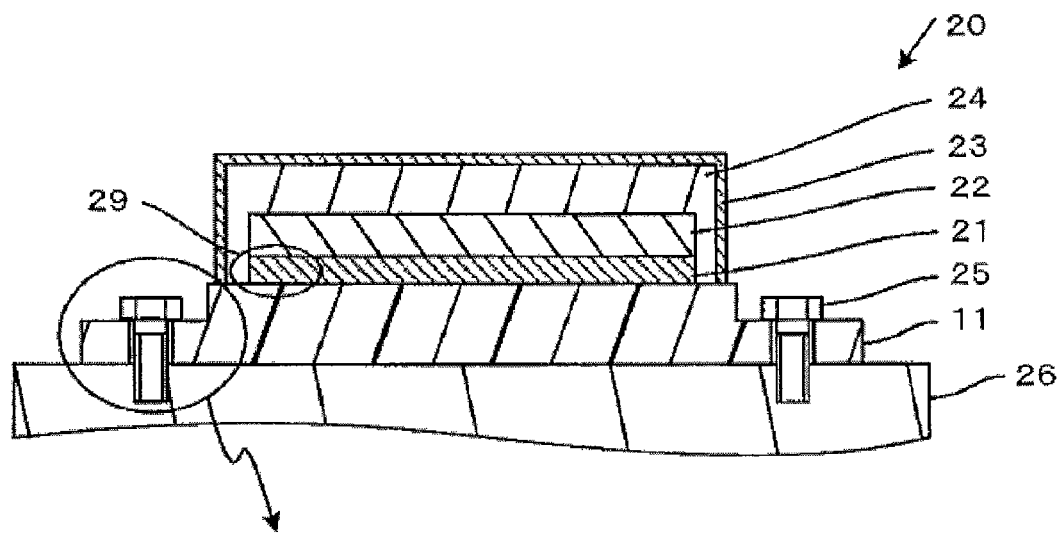
Figure 2C:
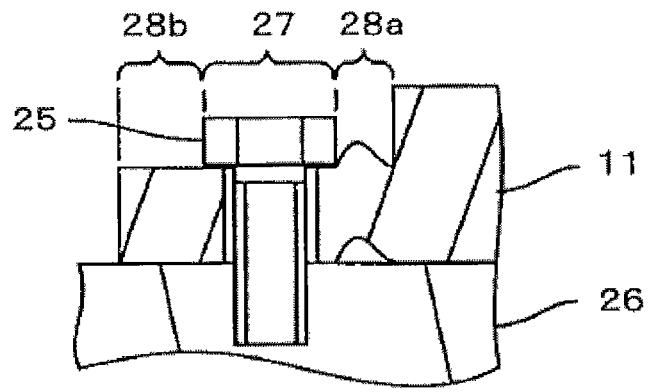

FIGS. 2A to 2C are figures showing a schematic representation of a semiconductor device attached to the base plate of FIG. 1 according to this embodiment, FIG. 2A is a cross-sectional view of the semiconductor device on the base plate, and FIG. 2B is a cross-sectional view showing the base plate, having the semiconductor device adhered thereto, further attached to the heat sink.

Referring first to FIGS. 1A and 1B, the base plate 11 of this embodiment has a rectangular shape with a first face 11a and a second face 11b which are opposed to each other. The base plate 11 is warped into a convex shape on at least the second face 11b thereof. The second face 11b of the base plate 11 is warped in a convex shape in order to ensure the reliability of the base plate 11 by using the energy in the base plate, when the base plate 11 is forced into a flattened shape, to force contact between the central region of the base plate and an underlying heat sink.

On the base plate 11, a first region 11c is provided in the middle of the first face 11a and a second region 11d which has via holes 12 extending therethrough is provided on the periphery (except the center) of the first face 11a. In this embodiment, the base plate is generally rectangular, and the second regions 11d are provided at each of the corners of the base plate 11. Because of the curvature of the base plate 11, when the base plate 11 is first placed upon and unsecured to the heat sink 26 (FIG. 2B, the four corners of the base place 11 are floating on, i.e., spaced from, the heat sink 26.

A first region 11c is a region on which, apart from the semiconductor chip, electrode parts or ceramic substrates, etc., are placed. In via holes 12, on the second region 11d, screws are inserted in order to secure the base plate 11 onto the heat sink (base).

In this embodiment, the center part is a region that does not include the four corners of the rectangle, and the periphery constitutes the region that includes the four corners of the rectangle and that does not include the center part.

The first region 11c is a region which includes short sides which are parallel to a diagonal of the rectangle and long sides which are parallel to the sides of the rectangle; its four corners can be notched or recessed to form the second regions 11d, and thus the outline of the first region 11c is an octagonal shape.

The second region 11d is generally triangular, and includes a first wall which is generally perpendicular to the line A-A of FIG. 1A (the diagonal of the plate) and sides which are parallel to the side walls of the rectangular profile of the plate; the four corners of the rectangles can be notched or recessed in order to form a hypotenuse triangle shaped recess which defines the outline and extent of the second regions 11C.

The base plate 11 can be made of metals with high thermal conductivity (such as copper or aluminum). The thickness H1 of the first region 11c is, for example, 3 mm. The thickness H2 of the second region 11d is provided in such a way as to be thinner than the thickness H1 of the first region 11c (H2<H1). An appropriate thickness H2 can be about ⅓ or ⅔ of the thickness H1.

As the thickness H2 is less than the thickness H1, there is a difference in height on the first face 11a at the boundary between the first region 11c and the second region 11d. Boundary 13 is linear between the first region 11c and the second region 11d which is essentially orthogonal to the diagonal of the rectangular-shaped base plate 11.

The base plate 11 can be prepared, for example, by using a pair of stamping or blanking dies which includes forming the convex shape of the plate 11 and simultaneously recessing the corners to form the second regions 11d.

Now, an explanation of the semiconductor device according to this embodiment will be made. As shown in FIG. 2A, in the semiconductor device 20 according to this embodiment, the inner part 22 having the semiconductor devices and circuitry formed thereon is bonded to the first region 11c of the first face 11a of the base plate 11, by the bonding agent 21.

The bonding agent 21 can be, for example, a conductive paste, resin adhesive sheet and solder, etc. The inner part 22 includes, as explained above, apart from the semiconductor chip, electrode parts and a ceramic substrate, for example.

While housing the inner part 22, a box-shaped case 23 is crowned on the first region 11c of the base plate 11. The case 23 is fixed on the first region 11c of the base plate 11 by, for example, an adhesive (not shown) which is made of a resin.

The gap between the inner part 22 and the case 23 is filled by filler 24 such as an epoxy resin. The case 23 and filler 24 are provided in order to protect the semiconductor device 22 from the external environment.

The filler 24 injects, for example, a liquid epoxy resin in the gap between the inner part 22 and the case 23 through a sealable conduit (not shown)provided in the case 23.

As shown in FIG. 2B and FIG. 2C, the semiconductor device 20 is attached to the heat sink 26 by inserting screws 25 in via holes 12 and fastening them into threaded holes in the underlying heat sink.

The screws 25 are used to tighten the base plate 11 to the heat sink 26; by correcting the warp on the base plate 11, they adhere the base plate 11 to a heat sink 26. In this case, it is helpful to sandwich a thermally conductive paste between the base plate 11 and the heat sink 26.

As the thickness H2 of the second region 11d of base plate 11 is less than the thickness H1 of the first region 11c (H2<H1), the rigidity/stiffness of the second region 11d is then lower than the rigidity/stiffness of the first region 11c. As a result, when the base plate 11 is secured to the heat sink 26 by attaching the screws or bolts 27 through the holes 12 in the second region 11d of the base plate, the second region will deform as shown at 28a in FIG. 2C at a location intermediate of the hole 12 and the first region 12c, thereby reducing stress in the first region. Likewise, because the distortion in the base plate occurs outside the central region 11c of the base plate, the induced stress on the semiconductor device is significantly reduced. The concentration of the stresses, caused by bending the warped base plate 11 to the contour of the heat sink 26, will result in higher stresses in the space between the via holes 12 and the middle region 11c, and may, where the stress is high enough, sacrificially buckle in that region. Thus, because the distortion caused by screw fastening of the base plate to the heat sink is captured in the second region 11d, it does not propagate to the bonding part 29, and the stress which otherwise will cause peeling of the inner part 22 from the base plate 11 is significantly reduced. Therefore, it is possible to maintain and improve the long-term reliability of the semiconductor device 20 by preventing the destruction of bonding layer 29.

Figure 3A:
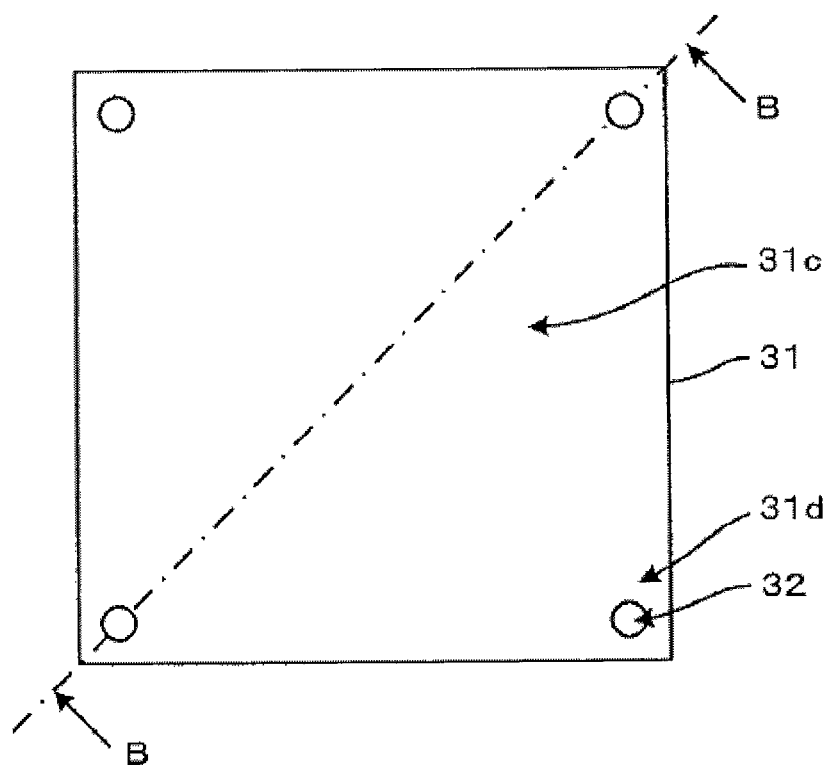
FIGS. 3A and 3B show a base plate in a comparative example according to the first embodiment.
Figure 3B:
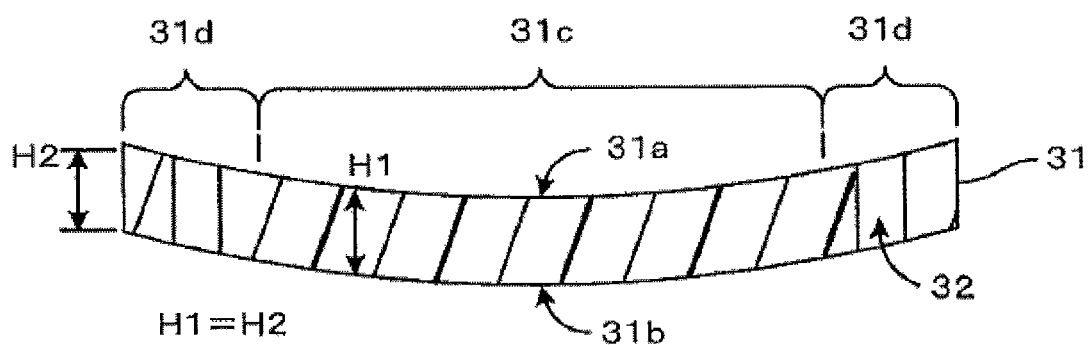
Figure 4A:
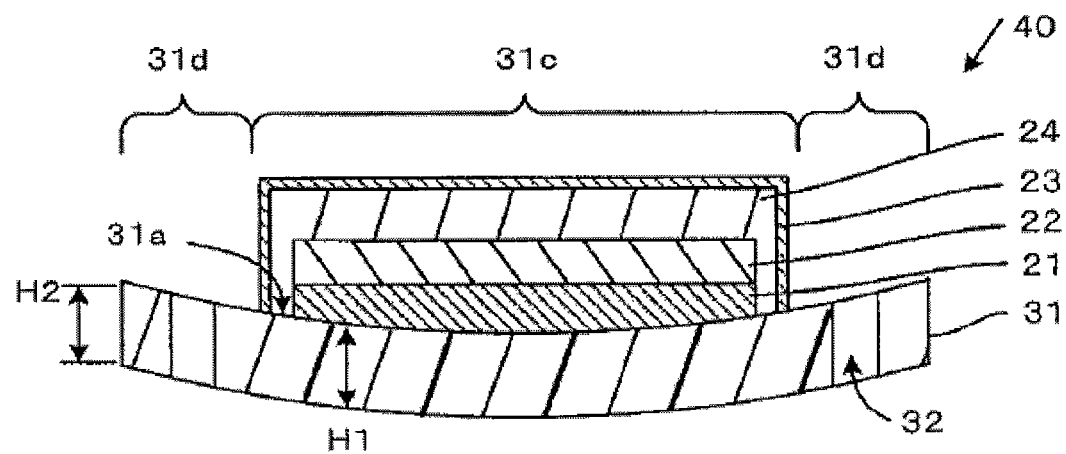
FIGS. 4A to 4C are cross-sectional views showing a schematic representation of a semiconductor device bonded to a base plate in a comparative example.
Figure 4B:
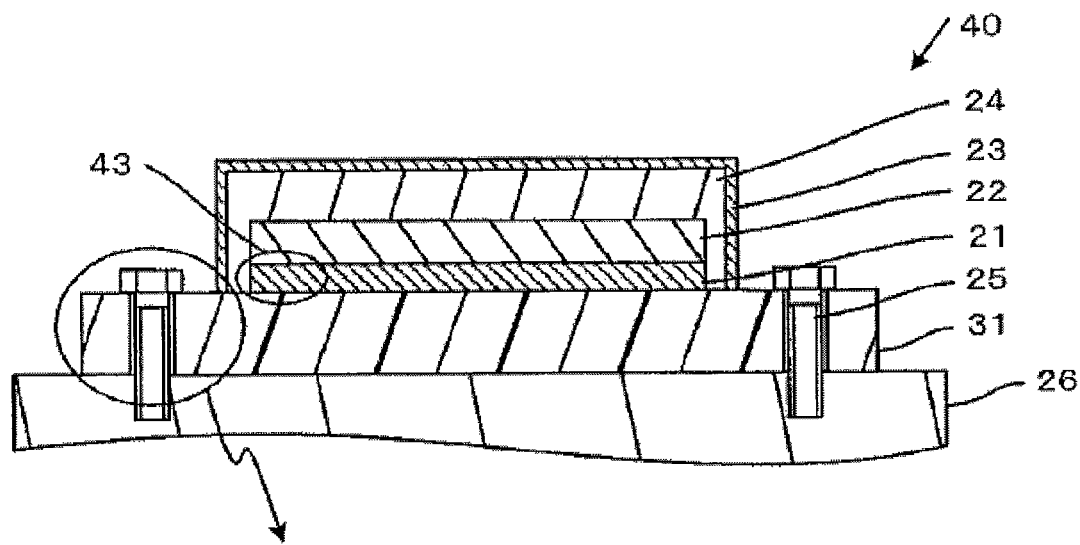
Figure 4C:
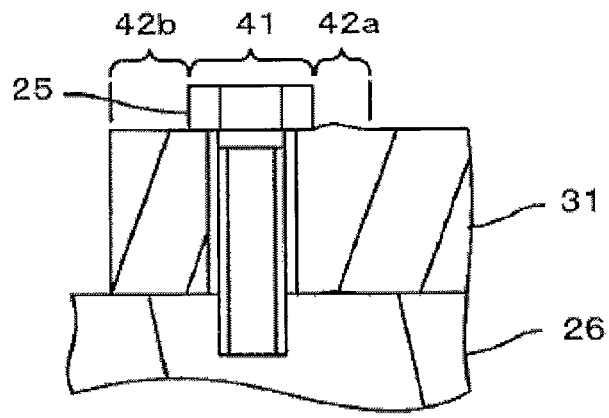

Now, an explanation of the features of the base plate and the semiconductor device in comparative examples will be made by referring to FIGS. 3A and 3B and FIGS. 4A to 4C. In FIGS. 3 and 4, the thickness H1 and H2 in the inner and outer regions are the same.

FIGS. 3A and 3B are figures showing the base plate in a comparative example, FIG. 3A is a ground plan of the base plate, and FIG. 3B is a cross-sectional view in the direction of the arrow cut along the line B-B in FIG. 3A. FIGS. 4A to 4C are figures showing the semiconductor device in a comparative example, FIG. 4A is a cross-sectional view of the semiconductor device, FIG. 4B is a cross-sectional view showing the state of semiconductor device when screwed to the heat sink, and FIG. 4C is an enlarged cross-sectional view showing the main parts of the semiconductor device when screwed to the heat sink.

First of all, an explanation of the base plate in comparative examples will be made. As shown in FIGS. 3A and 3B, the base plate 31 in the comparative example is a rectangle including a first face 31a and a second face 31b which are opposed to each other. The base plate 31 is warped in a convex shape on the second face 31b.

On the base plate 31, the first region 31c is provided in the center of the first face 31a and the second region 31d, which includes via holes 32, is provided on the peripheral part of the first face 31a.

The first region 31c is a region where, apart from the semiconductor chip, electrode parts and a ceramic substrate, etc. are placed. On the via holes 32 of the second region 31d, the screws which are used for screwing the base plate 31 in the heat sink (base) are inserted.

As the base plate 31 has a rectangular form, the second region 31d is provided on the four corners of the rectangle. When the base plate 31 is placed on the heat sink, the four corners of the base plate 31 extend with a gap between the corners and the heat sink.

As the thickness H1 of the first region 31c of the base plate 31 and the thickness H2 of the second region 31d of the base plate 31 are equivalent (H1=H2), there is no difference in level at the boundary of the first region 31c and the second region 31d.

Now, an explanation of the semiconductor device in a comparative example will be made. As shown in FIG. 4A, in the semiconductor 40 in the comparative example, the first region 31c of the first face 31a of the base plate 31 is bonded to the inner part 22 by the bonding agent 21.

The box-shaped case 23 which stores the inner part 22 is fixed on the first region 31c of the base plate 31 by an adhesive (not shown).

As shown in FIG. 3B and FIG. 3C, the semiconductor device 40 is screwed to the heat sink 26 by the screws 25 which are inserted in via holes 32.

By using the screws 25, the base plate 31 is tightened to the heat sink 26, in order to correct the warp of the base plate 31 and contact the base plate 31 to the heat sink 26.

In this case, as the thickness H2 of the second region 31d of the base plate 31 is equivalent to the thickness H1 of the first region 31c of the base plate 31, the rigidity of the first region 31c and the rigidity of the second region 31d are also equivalent.

As a result, the base plate 31 does not deform adjacent to the location of the peripheral screws or, even if it does deform, the deformation volume is negligible, as shown in FIG. 4C.

In case of deformation, for example, the first side 31a of the base plate 31 adjacent to the peripheral screws 42a slightly rises; the second side 31b of the base plate adjacent to the peripheral screws 42a will float or bend upwardly slightly over the heat sink 26.

As the base plate 31 adjacent to the peripheral screws 42a is hardly deformed, the distortion caused by fastening the base plate 31 to the heat sink is not sufficiently mitigated. As a result, it is difficult to suppress the propagation of the distortion and stresses on the bonding part 43 of the inner part 22 and the base plate 31.

If the distortion caused by fastening of the base plate 31 to the heat sink 26 propagates to the bonding part 43, this stress may cause peeling of the inner part 22 from the base plate 31. Therefore, the bonding part 43 is destroyed and the problems such as the degradation in the long-term reliability of the semiconductor device 40 arise.

On the other hand, as the semiconductor device 20 according to the first embodiment deforms the base plate adjacent to peripheral screw 28a as previously described, the distortion caused by the fastening of the base plate to the heat sink is sufficiently relaxed and the propagation of the distortion at the bonding part 29 of the inner part 22 and the base plate 11 can be suppressed.

In order to confirm this, the results of the simulation of the deformation state of the base plate 11 and the base plate 31 is explained by using FIGS. 5A and 5B and FIGS. 6A and 6B.

The simulation is derived using the finite element method. The conditions of the simulation are set as follows.

In base plate 11, H2=H1/2 and in base plate 31, H2=H1. Before applying the load, the base plates 11 and 31 are flat. By setting the base plates 11 and 31 as cantilevered beams, the same load is applied on fastening the screws 27 and 41 of the second regions 11d and 31d.

Figure 5A:
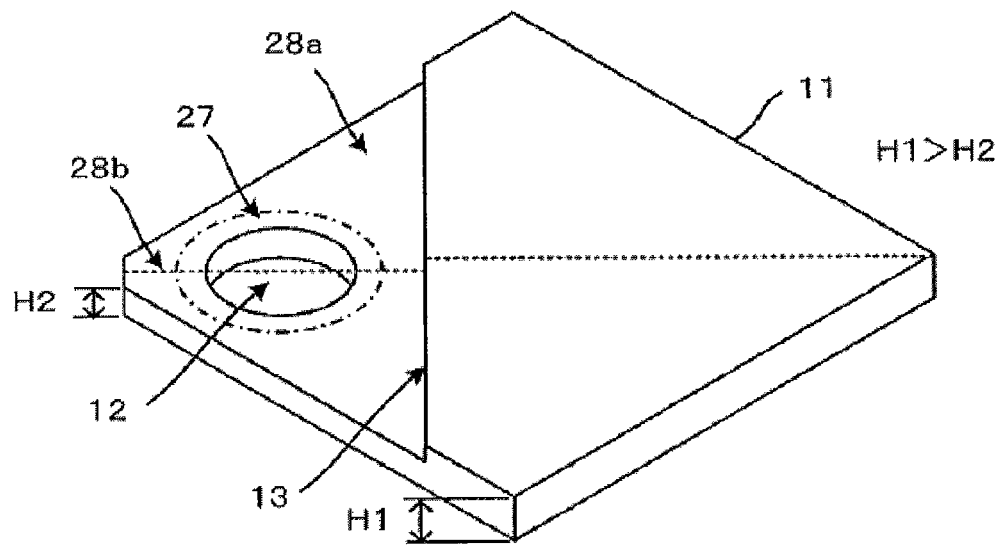
FIGS. 5A and 5B are perspective views showing the comparison of the main parts in a comparative example of a base plate.
Figure 5B:
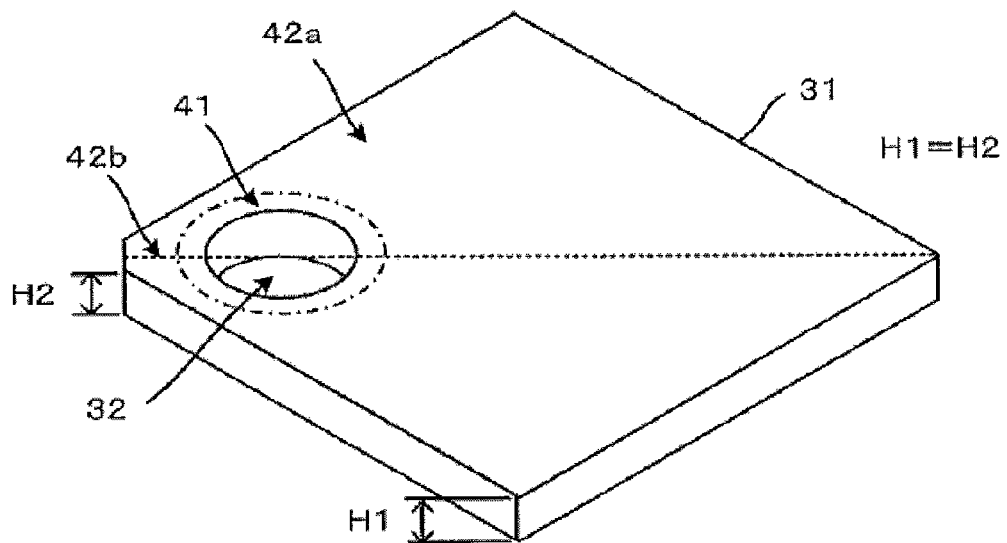

FIGS. 5A and 5B are perspective views showing the contrast between the main parts of the base plate 11 in this embodiment before applying the load and the main parts of the base plate 31 in comparative examples before applying the load. FIG. 5A is a perspective view showing the main parts of the base plate 11 in this embodiment and FIG. 5B is a perspective view showing the main parts of the base plates 31 in comparative examples.

Figure 6A:
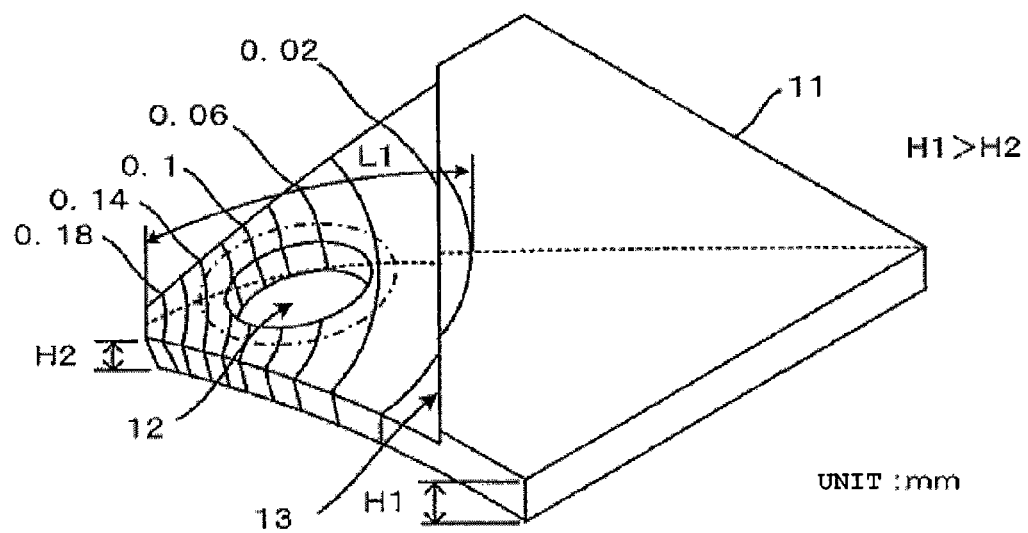
FIGS. 6A and 6B are perspective views showing the comparison of the simulation results of the deformed state of the main parts in a comparative example of a base plate.
Figure 6B:
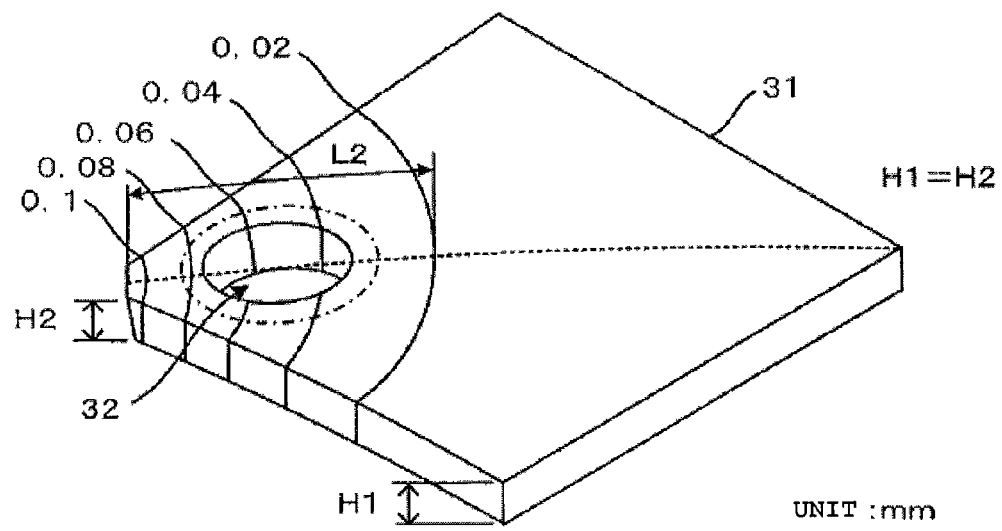

FIGS. 6A and 6B are perspective views showing the contrast between the main parts of the base plate 11 in this embodiment after applying the load and the main parts of the base plate 31 of the comparative example after applying the load. FIG. 6A is a perspective view showing the main parts of the base plate 11 in this embodiment and FIG. 6B is a perspective view showing the main parts of the base plates 31 in comparative examples.

According to FIGS. 5A and 5B and FIGS. 6A and 6B, the dashed lines show the diagonal of the rectangular base plate and the regions surrounded by a dashed line shows fastening screws. According to FIGS. 6A and 6B, the solid lines which have an arc shape are contour showing the deformation volume. The numbers drawn from the contours shows the deformation volume (mm).

Now, an explanation of the comparative examples of the base plate 31 will be made. As shown in FIG. 5B, before applying the load, the base plate 31 is flat.

As shown in FIG. 6B, when applying the load, the tips of the corners of the base plate 31 are bent slightly downwardly. This deformation distance is about 0.1 mm. The distance (deformation length) from the tips of the corners of the base plate 31 to the part where the deformation distance equals to 0.02 mm is referred to as L2.

Now, an explanation of the base plate 11 in this embodiment will be made. As shown in FIG. 5A, before applying the load, the base plate 11 is flat.

As shown in FIG. 6B, when applying the load, the tips of the corners of the base plate 11 are bent slightly downwardly. This deformation distance is about 0.18 mm. The distance (deformation length) from the tips of the corners of base plate 11 to the part where the deformation volume equals to 0.02 mm is referred to as L1. The deformation of base plate 11 goes beyond the boundary 13 and extends into the first region 11c.

The deformation distance of the base plate 11 (0.18 mm) is about two-times higher than the deformation distance of base plate 31 (0.1 mm). The deformation length L1 of base plate 11 is longer than the deformation length L2 of the base plate 31.

The base plate 11 in this embodiment can be easily deformed due to the pressing force, therefore, it can be understood that the deformation distance is higher compared to the comparative examples of base plate 31.

Because of this, it is better to deform by deforming peripheral screws than by fastening screws because the distortion caused will be relaxed, and it is possible to confirm that the distortion does not propagate on bonding part between inner part and base plate.

As previously described, in this embodiment, the thickness H2 of the second region 11d of base plate 11 is set to be less than the thickness H1 of the first area 11c of base plate 11 (H2<H1).

As a result, if the semiconductor device 20 is screwed to the heat sink 26, the region of the second region adjacent to the peripheral screw 28a of the base plate 11 will be deformed. Because of this, the distortion caused by the fastening screw can be sufficiently relaxed; therefore, it is possible to suppress the propagation of the distortion on the bonding part 29 between the inner part 22 and the base plate 11. Thus, it is possible to obtain a base plate or a semiconductor device which is able to relax the distortion caused by screw operations.

Here, the case wherein the boundary 13 between the first region 11c of the base plate 11 and the second region 11d is linear has been discussed, but this is not limited; for example, the boundary 13 can also be curved.

Figure 7:
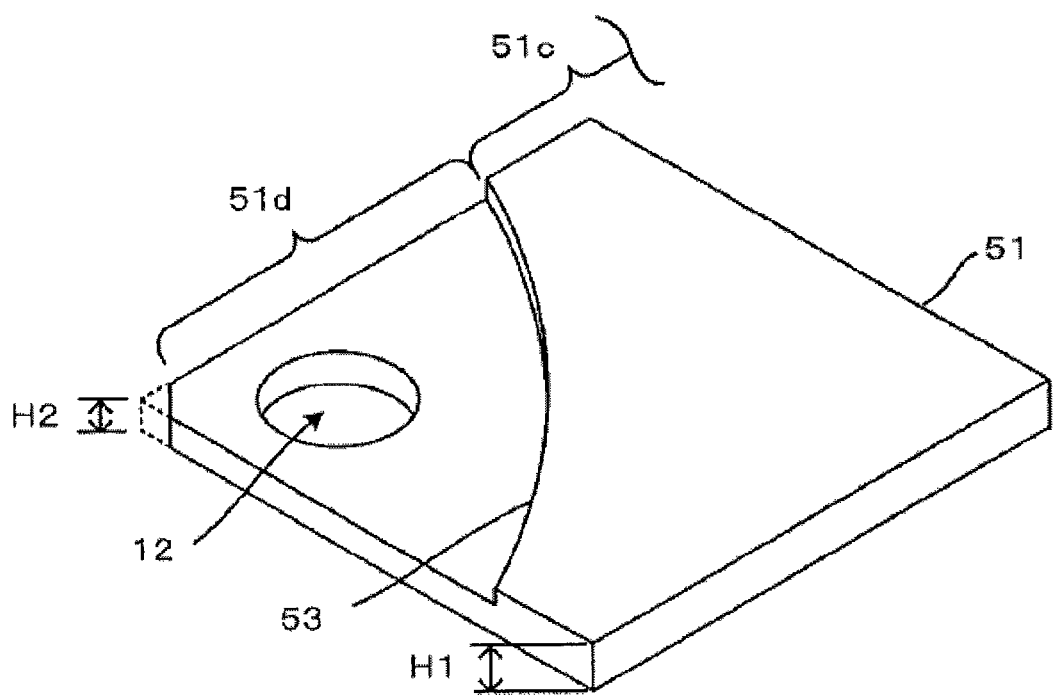
FIG. 7 is a perspective view showing another base plate according to a first embodiment.

FIG. 7 is a figure showing a base plate with a curved boundary between the first and second regions. As shown in FIG. 7, on the base plate 51, the boundary 53 between the first region 51c and the second region 51d has an arc shape.

For the boundary 53, according to the results of the simulation shown in FIG. 6A, for example, by drawing from the contour, when the deformation volume is equal to 0.02 mm, the arc shape is appropriate, and the entire bending up to 0.2 mm can be accommodated in the second region.

The case wherein the second region 11d is thinner than the first face 11a where the inner part 22 is placed has been discussed, but this is not particularly limited. It is also possible to make the second region thinner than the second face.

Figure 8A:
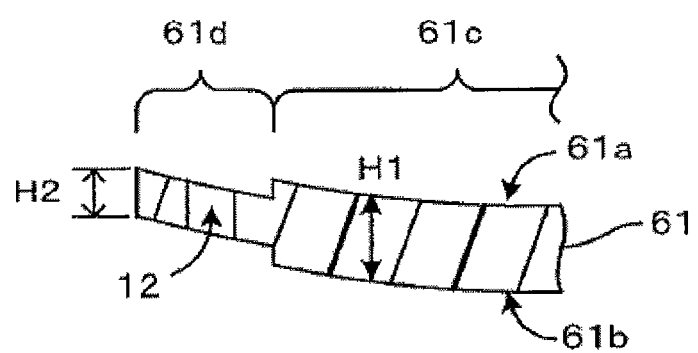
FIGS. 8A and 8B are cross-sectional views showing another base plate according to a first embodiment.
Figure 8B:
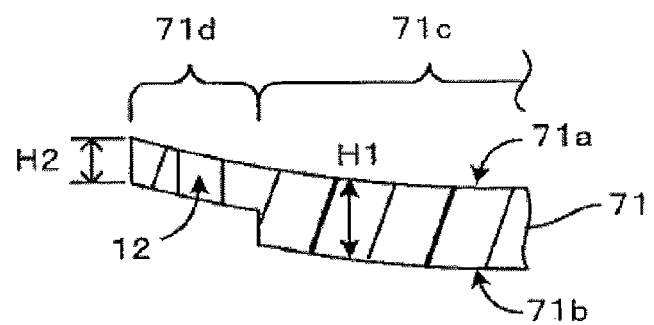

FIGS. 8A and 8B are figures showing the main parts of the base plate on which the second region is thinner than its second face. As shown in FIG. 8A, on the base plate 61, the second region 61d is thinner than both the first face 61a and the second face 61b.

As shown in FIG. 8B, on the base plate 71, the second region 71d is thinned by the second face 71b.

(Embodiment 2)

Figure 9A:
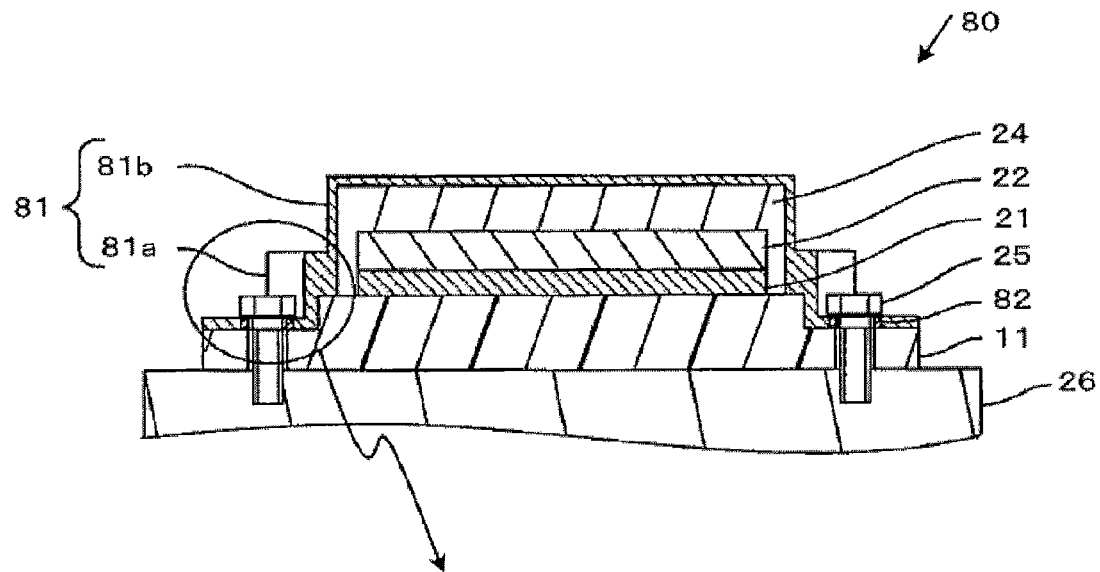
FIGS. 9A and 9B are cross-sectional views showing a semiconductor device according to a second embodiment.
Figure 9B:
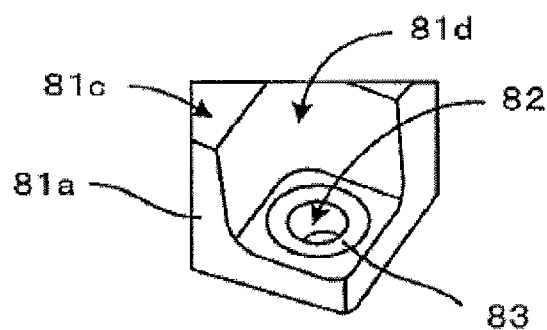

This embodiment will be explained by using FIGS. 9A and 9B. FIGS. 9A and 9B are figures showing the semiconductor device according to this embodiment. FIG. 9A is a cross-sectional view showing the semiconductor device and FIG. 9B is an enlarged perspective view of the main parts of the semiconductor device.

According to this embodiment, the same components as previously described in the first embodiment which are denoted by the same reference numerals will be omitted, and only different parts will be explained. The different point between the first embodiment and this second embodiment is a modification of the second region wherein fastening screws are connected to secure the plate to a heat sink.

As the second region is modified, such that the case 81 covering the semiconductor device 80 extends into the second regions and overlays the second region. Thus, the case forms an integrated structure which overlies the central region of the base plate, and includes a cover portion 81b and a downwardly extending foot region 81d, terminating in a generally flat-shaped of base part 81a which overlays the region of the second region of the base plate where the fastening screw 27 and the peripheral regions 28a and 28b are located. Via holes 82 are provided to align with the attachment holes which extend through the second region, and on via holes 82, a metal collar 83 is fitted surrounding the via holes 82. The collar 83 can be aluminum or brass, for example. In the same way as with the semiconductor device 20 shown in FIGS. 2A to 2C, the gap between the cover part 81b and the inner part 22 is filled by the filler 24.

The semiconductor device 80 is attached to the heat sink 26 by fasteners or screws as with the embodiment of FIGS. 1 and 2. However, the base of the heads of the screw 25 or fastener overlays and bears upon the collar 83 fitted in the via holes 82 of the notched part 81d.

The metal collar 83 is used in order to maintain the screw fastening force over a long period of time because its resistance against deformation, damage and aging due to screw fastening force is high compared to the notched part 81d which is made of a resin.

While the base plate 11 is fixed to the heat sink 26 by the screws 25, the base part 81a of the case 81 is fixed to the base plate 11. Therefore, the peripheries of the collar 82, in order to fix the case 81 to the base plate 11, it is not necessary to apply an adhesive.

By using the adhesive in order to fix the case on base plate, in the case 23 shown in FIGS. 2A to 2C, the adhesive protruding between the case 23 and the base plate 11 flows out and interferes with the screw fastening by reaching the via holes 12.

In the case 81 in this embodiment, as the base part 81a covers the fastening screw 27 and the peripheral screws 28a and 28b, most of the adhesive that protrudes between the base part 81a of the case 81 and outside the first region 11c of the base plate 11 stays in the gap between the base part 81a of the case 81 and the sides which configure the boundary 13 of base plate 11. As a result, the adhesive reaches the collar 82 and do not interfere with the fastening screw.

As previously explained, in this embodiment, the case 81 configures the base part 81a and the storing part 81b integrally. The base part 81a covers the fastening screw 27 and the regions thereof peripheral to the screw locations, 28a and 28b.

Because of this, when fixing the case 81 and the base plate 11 by using an adhesive, the adhesive flows out and the advantage in preventing the interference in the fastening screws can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying Claims and their equivalents are intended to cover such forms or modifications as would fall within the scope and spirit of the inventions.

What is claimed is:

1. A base plate comprising:
    a first area with a first face and a second face that are opposed to each other, in which the second face has a convex surface over a span of the entire second face, the first area provided in a center of the plate; and
    a second area, having holes extending therethrough, at a periphery of the first area, wherein
    a thickness of the second area is less than a thickness of the first area.

2. The base plate according to claim 1, wherein:
    the base plate has a rectangular profile and corners,
    the second area comprises a plurality of second area portions, each of which is provided at one of the corners, and
    a continuous linear wall extends between each of the second area portions and the first area.

3. The base plate of claim 2, wherein the linear wall follows a straight line path.

4. The base plate of claim 2, wherein linear wall is curved.

5. The base plate of claim 1, wherein the second area is inset from the first face.

6. The base plate of claim 1, wherein the second area provides a stress relief region to reduce stress imposed in the first area when the contour of the base plate is changed.

7. The base plate of claim 1, wherein the first and the second areas are formed of the same material.

8. A base plate comprising:
    a first area with a first face and a second face that are opposed to each other, in which the second face has a convex surface, the first area provided in the center of the plate; and
    a second area, having holes extending therethrough, at a periphery of the first area, wherein
    at least one aperture is formed through the second area, and
    the second area is made of a first material and a second material surrounding the aperture, the second material having a hardness that is greater than that of the first material and the second area having a thickness that is less than that of the first area.

9. A mounting assembly comprising:
    a base plate comprising:
        a first area with a first face and a second face that are opposed to each other, in which the second face has a convex surface over a span of the entire second face and the first area is located in a central area of the plate;

a second area, provided with a hole therethrough, disposed at a periphery of the first area, wherein a thickness of the second area is less than a thickness of the first area; and a semiconductor device mounted to a first side of the first area of the base plate via a bonding agent.

10. The mounting assembly according to claim 9, further comprising:

a case overlying the semiconductor device and the base plate; and a resin material disposed between the case and the semiconductor device.

11. The mounting assembly according to claim 10, wherein:

the second area includes a portion thereof which extends between the hole and the first portion;

a heat sink is secured to the base plate by at least one fastener extending through the hole in the second area, the second face of the base plate being positioned against the heat sink across a span of the first area; and the portion of the second area has a deformed portion therein.

12. The mounting assembly according to claim 11, wherein the deformed portion is buckled.

13. The mounting assembly of claim 11, wherein the first area and second area are formed of a single material and a generally linear wall joins the first and the second areas.

14. The mounting assembly of claim 13, wherein the base plate is a stamping die.

15. The mounting assembly of claim 11, wherein the second area is made of a first material and a second material of a higher hardness than the first material, the second material surrounding the hole extending through the second area.

* * * * *